US009801300B2

(12) United States Patent
Wang et al.

(10) Patent No.: US 9,801,300 B2
(45) Date of Patent: Oct. 24, 2017

(54) ELECTRICAL MODULES AND MODULAR ELECTRONIC BUILDING SYSTEMS

(71) Applicants: Microduino Inc., Westlake Village, CA (US); Meike Technology (Beijing) Ltd., Beijing (CN)

(72) Inventors: Zhenshan Wang, Westlake Village, CA (US); Kejia Pan, Westlake Village, CA (US); Bin Feng, Westlake Village, CA (US)

(73) Assignees: MICRODUINO INC., Westlake Village, CA (US); MEIKE TECHNOLOGY (BEIJING) LTD., Beijing (CN)

( * ) Notice: Subject to any disclaimer, the term of this patent is extended or adjusted under 35 U.S.C. 154(b) by 0 days.

(21) Appl. No.: 14/721,341

(22) Filed: May 26, 2015

(65) Prior Publication Data

US 2016/0249478 A1 Aug. 25, 2016

(30) Foreign Application Priority Data

Feb. 20, 2015 (CN) .......................... 2015 1 0085854

(51) Int. Cl.
*H05K 7/14* (2006.01)

(52) U.S. Cl.
CPC ................................. *H05K 7/1435* (2013.01)

(58) Field of Classification Search
None
See application file for complete search history.

(56) References Cited

U.S. PATENT DOCUMENTS 4,558,914 A * 12/1985 Prager .................. H05K 7/1441 361/679.4
4,743,202 A * 5/1988 Bach .................... H01R 9/2408 439/53
5,676,553 A * 10/1997 Leung .................. H01R 31/005 439/74
5,677,830 A * 10/1997 Nogas .................. H05K 7/1435 361/732
5,825,627 A * 10/1998 Tamura ................ G11B 33/128 361/730
5,838,548 A * 11/1998 Matz .................... H05K 5/0021 174/50.51

(Continued)

*Primary Examiner* — Xanthia C Cunningham
(74) *Attorney, Agent, or Firm* — Anova Law Group, PLLC

(57) ABSTRACT

The present disclosure provides an electrical module and a modular electrical building system including electrical modules. The electrical module includes a printed circuit board (PCB), a housing member, one or more magnets, and one or more inter-locking parts. The PCB has a top surface, a bottom surface, and opposite sides between the top surface and the bottom surface. The housing member is attached to each side of two opposite sides of the PCB and includes an opening in a bottom surface. The magnets are arranged within the housing member and are capably of magnetically attaching the electrical module to another electrical module. Each inter-locking part is configured to pass through the housing member on each side of the PCB. Each inter-locking part has a protrusion extending from a top surface of the housing member and is exposed to the opening in the bottom surface of the housing member.

18 Claims, 9 Drawing Sheets

100

1
3
4
4
3
4
4
5

(56) References Cited

U.S. PATENT DOCUMENTS

| | | | | |
|---|---|---|---|---|
| 5,984,732 | A * | 11/1999 | Mehring | H05K 5/0021 439/701 |
| 6,036,505 | A * | 3/2000 | Zell | H05K 1/145 439/74 |
| 6,106,316 | A * | 8/2000 | Barringer | H01R 13/193 439/263 |
| 6,129,605 | A * | 10/2000 | Cyrus | A63H 33/04 446/108 |
| 6,137,686 | A * | 10/2000 | Saye | G06F 1/1626 361/679.43 |
| 6,420,953 | B1 * | 7/2002 | Dadafshar | H01F 27/027 336/200 |
| 6,431,879 | B2 * | 8/2002 | Brekosky | 361/804 |
| 6,522,550 | B1 * | 2/2003 | Nishio | H05K 5/0021 361/679.4 |
| 7,099,158 | B1 * | 8/2006 | Bjorklund | H04Q 1/02 248/346.03 |
| 7,184,272 | B1 * | 2/2007 | Harlacher | H05K 7/023 361/728 |
| 7,589,974 | B2 * | 9/2009 | Grady | H05K 7/1492 174/520 |
| D667,895 | S * | 9/2012 | Rya | D21/500 |
| 8,491,312 | B2 * | 7/2013 | Rudisill | H01R 11/30 439/39 |
| D695,678 | S * | 12/2013 | Haberlein | D13/102 |
| 8,715,030 | B2 * | 5/2014 | Chin | A63H 33/086 273/276 |
| 8,767,409 | B2 * | 7/2014 | Cheng | H01L 23/552 361/763 |
| 9,019,718 | B2 * | 4/2015 | Bdeir | H01R 11/30 361/792 |
| 9,407,251 | B1 * | 8/2016 | Passmore | H05K 1/0243 |
| 2002/0069603 | A1 * | 6/2002 | Zornes | C04B 38/0022 52/612 |
| 2005/0242434 | A1 * | 11/2005 | Boggs | H01L 21/4853 257/737 |
| 2007/0173095 | A1 * | 7/2007 | Bin-Nun | A63H 33/108 439/219 |
| 2009/0141463 | A1 * | 6/2009 | Sholl | H05K 7/1407 361/758 |
| 2009/0253325 | A1 * | 10/2009 | Brookstein | D03D 1/0088 442/239 |
| 2011/0021107 | A1 * | 1/2011 | Nag | A63H 33/042 446/91 |
| 2012/0218211 | A1 * | 8/2012 | McRae | G06F 1/1656 345/173 |
| 2013/0050958 | A1 * | 2/2013 | Bdeir | H01R 13/6205 361/730 |
| 2013/0343017 | A1 * | 12/2013 | Stoehr | H05K 5/006 361/752 |
| 2013/0343025 | A1 * | 12/2013 | Bdeir | H01R 13/6205 361/803 |
| 2014/0125321 | A1 * | 5/2014 | Dames | G01R 15/181 324/127 |
| 2015/0236444 | A1 * | 8/2015 | Bdeir | H01R 11/30 361/792 |
| 2015/0328803 | A1 * | 11/2015 | Burns | B29C 33/3857 264/482 |
| 2015/0367247 | A1 * | 12/2015 | Kosmo | A63H 33/42 446/71 |

* cited by examiner

ELECTRICAL MODULES AND MODULAR ELECTRONIC BUILDING SYSTEMS

CROSS-REFERENCES TO RELATED APPLICATIONS

This application claims priority to Chinese Patent Application No. CN201510085854.9, filed on Feb. 20, 2015, the entire content of which is incorporated herein by reference.

FIELD OF THE DISCLOSURE

The present disclosure generally relates to the field of electronics and, more particularly, relates to electrical modules, modular electronic building systems, and electrical building products.

BACKGROUND

Nowadays, technological devices are widely used by children and/or adults in their day-to-day life. However, most of them don't know how these devices work, or how to make their own. In fact, there is a big gap between what is taught to an average person and what is used and consumed by that person. It is therefore desirable for children or adults to be able to use functional electrical modules without having to be an expert to program or learn the many complexities involved with these advanced electronics. It is also desirable for children or adults to be able to create their own interactive toys, objects, or products with custom-designed interactive behavior without having to be an expert to program or learn the many complexities involved with these advanced electronics.

The disclosed electrical modules, modular electronic building systems, and electrical building products are directed to solve one or more problems set forth above and other problems in the art.

BRIEF SUMMARY OF THE DISCLOSURE

According to various embodiments, there is provided an electrical module. The electrical module includes a printed circuit board (PCB), a housing member, one or more magnets, and one or more inter-locking parts. The printed circuit board (PCB) has a top surface, a bottom surface, and opposite sides between the top surface and the bottom surface. The housing member is attached to each side of two opposite sides of the PCB. The housing member includes an opening in a bottom surface of the housing member. The one or more magnets are arranged within the housing member and are capably of magnetically attaching the electrical module to another electrical module. The one or more inter-locking parts are configured to pass through the housing member on each side of the PCB. Each inter-locking part has a protrusion extending from a top surface of the housing member and is exposed to the opening in the bottom surface of the housing member.

According to various embodiments, there is also provided a modular electrical building system. The modular electrical building system includes a plurality of electrical modules vertically stacked to have a first electrical module on a second electrical module. Each electrical module includes a printed circuit board (PCB), a housing member, one or more magnets, and one or more inter-locking parts. The PCB has a top surface, a bottom surface, and opposite sides between the top surface and the bottom surface. The housing member is attached to each side of two opposite sides of the PCB and the housing member includes an opening in a bottom surface of the housing member. One or more magnets are arranged within the housing member and capably of magnetically attaching the electrical module to another electrical module. One or more inter-locking parts are configured to pass through the housing member on each side of the PCB. Each inter-locking part has a protrusion extending from a top surface of the housing member and is exposed to the opening in the bottom surface of the housing member.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides an electrical module (also referred to as a "module" or "electrical block" or "block"), a modular electronic building system including a plurality of (electrical) modules stacked together, and/or an electrical building product including the modular electronic building system(s) coupled with a different type of building block system(s).

Figure 1:
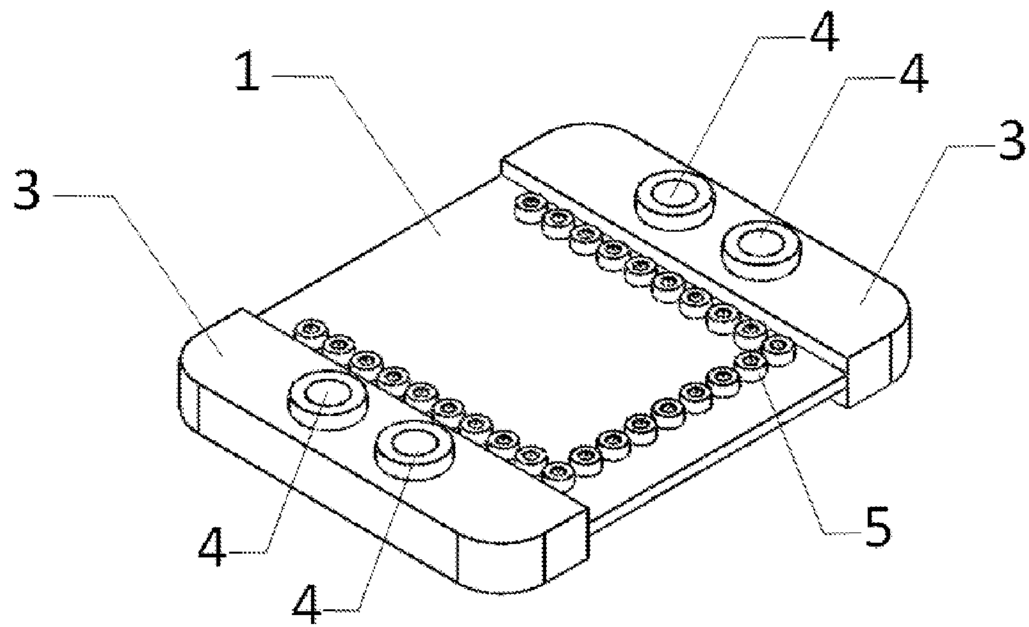
FIG. 1 illustrates a top perspective view of an exemplary module consistent with various disclosed embodiments.
Figure 2:
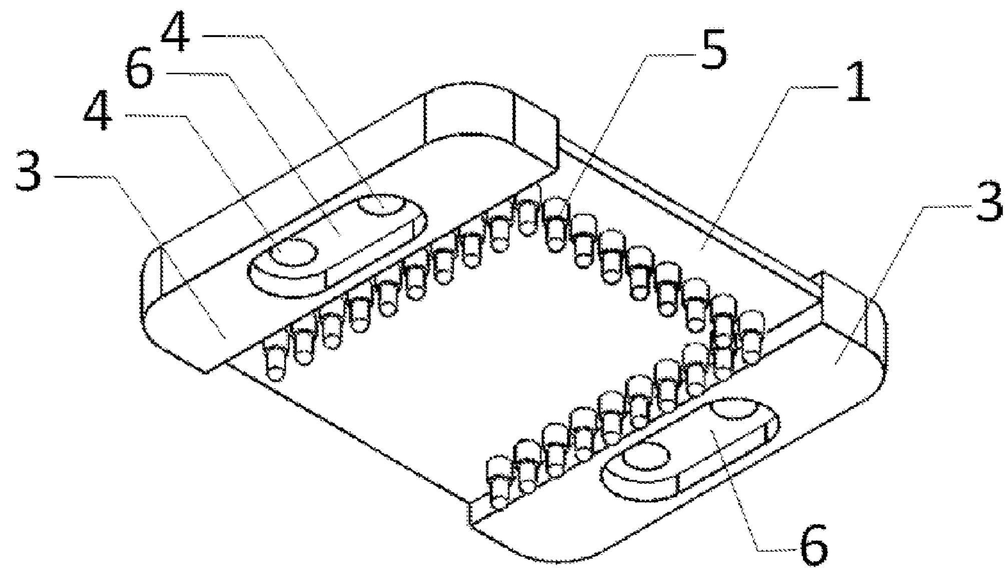
FIG. 2 illustrates a bottom perspective view of an exemplary module consistent with various disclosed embodiments.
Figure 3:
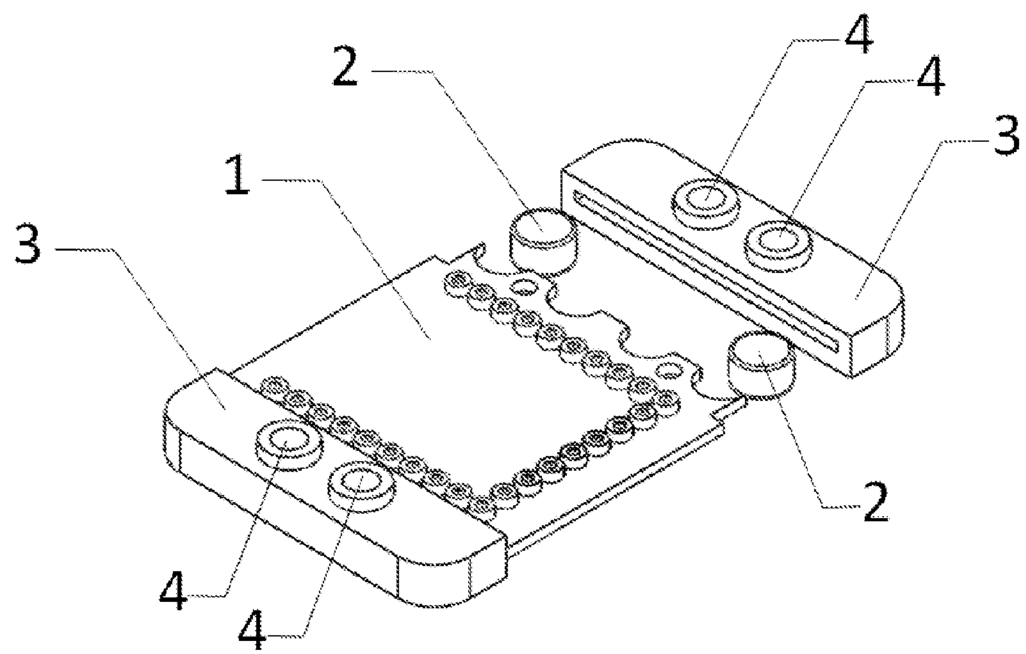
FIG. 3 illustrates an exploded view of an exemplary module having a magnetic connection consistent with various disclosed embodiments.
Figure 4:
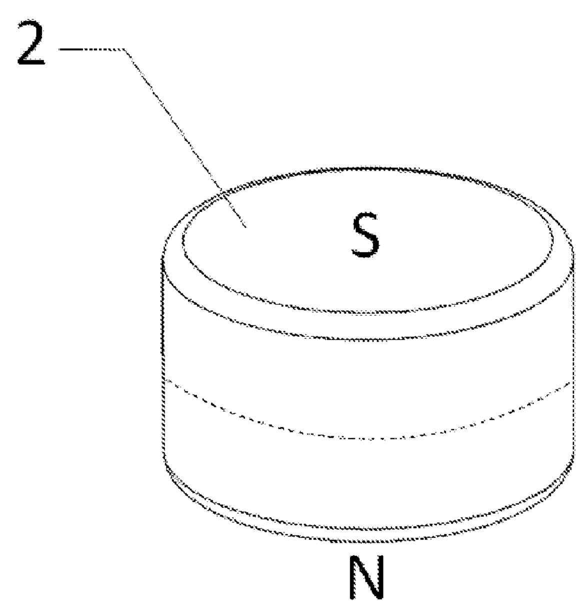
FIG. 4 illustrates an exemplary magnet for magnetically connecting modules in a modular electronic building system consistent with various disclosed embodiments.

FIGS. 1-3 illustrate an exemplary electrical module used to build a modular electronic building system consistent with various disclosed embodiments. FIG. 4 illustrates an exemplary magnet for magnetically attaching modules in a modular electronic building system consistent with various disclosed embodiments.

As shown, the exemplary electrical module may include a printed circuit board (PCB) 1, magnets 2, housing members 3, and/or inter-locking parts 4. More components can be added and existing components can be modified or omitted.

As shown, the PCB 1 may be configured between two housing members 3. For example, two opposite sides (e.g., a left side and a right side) of the PCB 1 may be inserted into corresponding housing members 3. The PCB 1 may have a top surface and a bottom surface, which, for example, may be used as input/output interfaces for electrical chips/components/devices configured thereon. For example, various electrical chips/components/devices may be configured on the bottom surface of the PCB 1, while any desired components, that may or may not be electrical chips, such as icons, logos, etc. in a form of text, image, and/or 3-D structure, may be configured on the top surface of the PCB 1. The two opposite sides of PCB 1 may be between the top/bottom surfaces of the PCB1. The PCB 1 may have a top view shape, such as a rectangular shape, a square shape, and/or a trapezoid shape.

Each housing member 3 may enclose a magnetic connecting component including, e.g., magnet(s) 2, as shown in FIG. 3-4. In one embodiment, two magnets 2 may be discretely arranged within each housing member 3, although any number of magnets, more or less than two, may be encompassed in the housing member of the disclosed modules in the present disclosure.

The magnets 2 may be wrapped around by the housing member material. The magnets 2 may be molded and securely positioned in each housing member 3 in a specific arrangement as desired. In one embodiment, the arrangement of the two magnets 2 may be substantially the same within each housing member 3, while each housing member 3 may be symmetrically configured on opposite sides of the PCB 1, as shown in FIGS. 1-3.

The magnets 2 in each housing member 3 may act as polarizing and locking elements between different modules in the modular electronic building system. For example, substantially all of the magnets 2 in each module may have same surface pole on the top surface and same surface pole on the bottom surface of each module.

When two modules tend to be attached and stacked together, only one specific way, i.e., the correct way, may be allowed to magnetically attach the modules together, due to attraction force between opposite poles of magnets in one module and in the next module. With such configurations, it is impossible to wrongly connect two modules (e.g., to wrongly have one module undesirably upside-down), because like poles from two different modules may be repulsed from one another.

As such, the magnets 2 may provide magnetic connection/bonding between modules and to stack up the modules to form a modular electronic building system. For example, modules may be magnetically stacked with one on another in a vertical direction, by using the magnets similarly (or substantially identically) configured within housing members 3 in each module. In a specific embodiment, four magnets may be configured inside of four corners of each module to facilitate users/players/makers to connect different modules quickly and correctly. Note that the magnets 2 are not electrically connected to the PCB 1.

Figure 5:
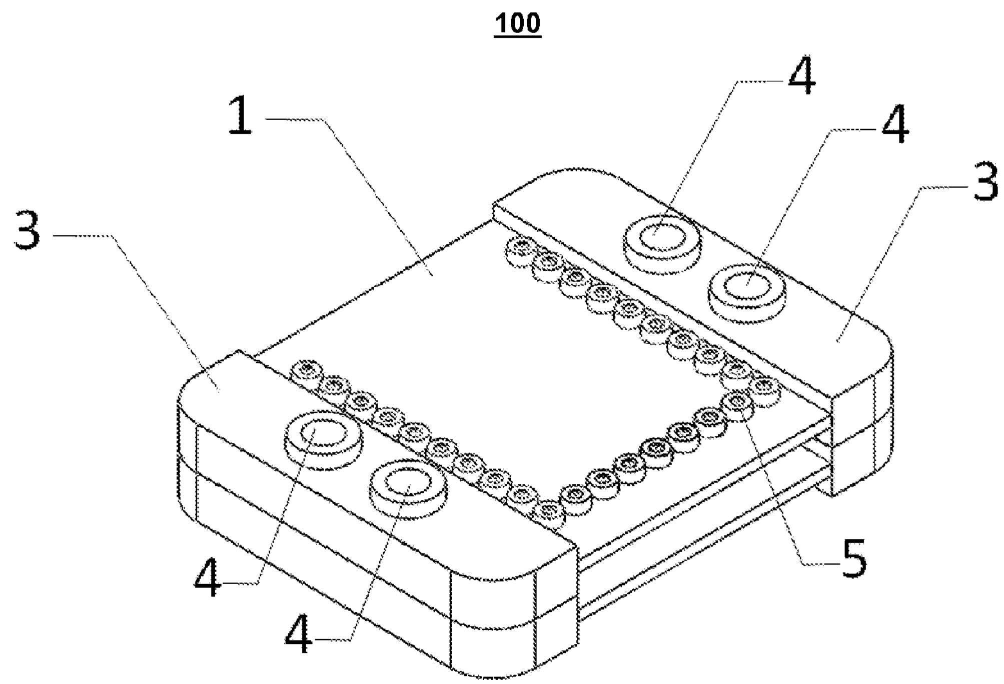
FIG. 5 illustrates a top perspective view of an exemplary modular electronic building system having stacked modules consistent with various disclosed embodiments.
Figure 6:
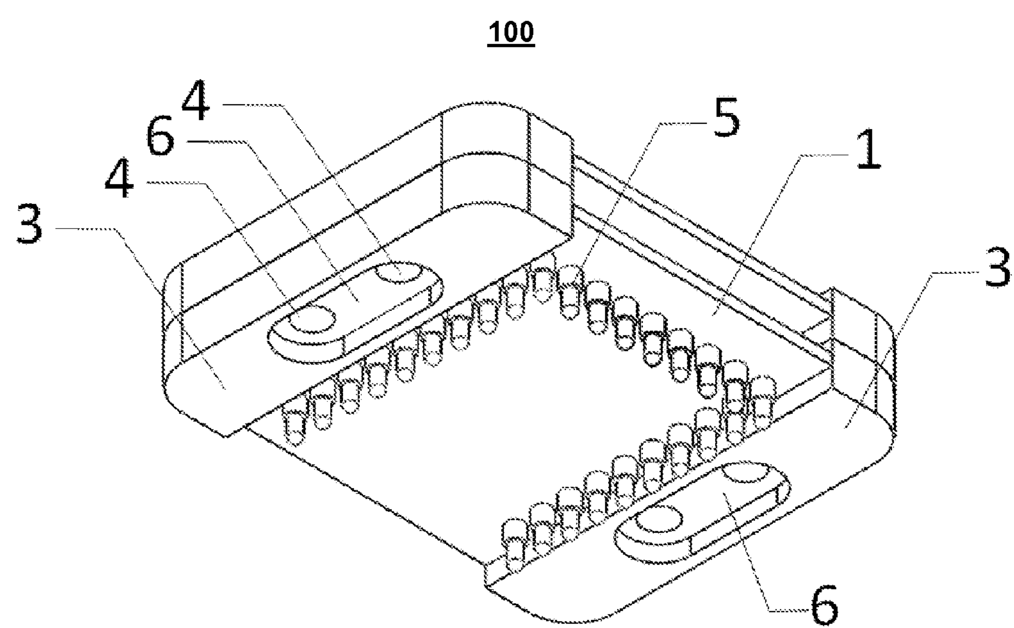
FIG. 6 illustrates a bottom perspective view of the exemplary modular electronic building system in FIG. 5 consistent with various disclosed embodiments.

FIGS. 5-6 illustrate top and bottom perspective views of an exemplary modular electronic building system 100 having two modules stacked together consistent with various disclosed embodiments. For illustration purposes, the exemplary modular electronic building system 100 shown in FIGS. 5-6 includes two exemplary modules, although one of ordinary skill in the art would appreciate that any number of modules, more or less than two, may be included in a modular electronic building system. In addition, those modules in a same modular electronic building system may individually or in group have same or different electrical chips/components/devices integrated therewith.

Figure 7:
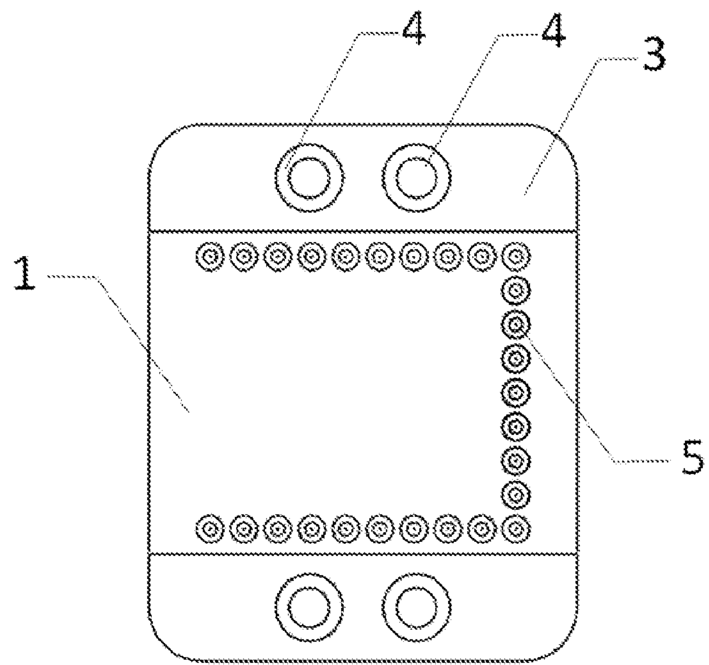
FIG. 7 illustrates a top view of another exemplary module consistent with various disclosed embodiments.
Figure 8:
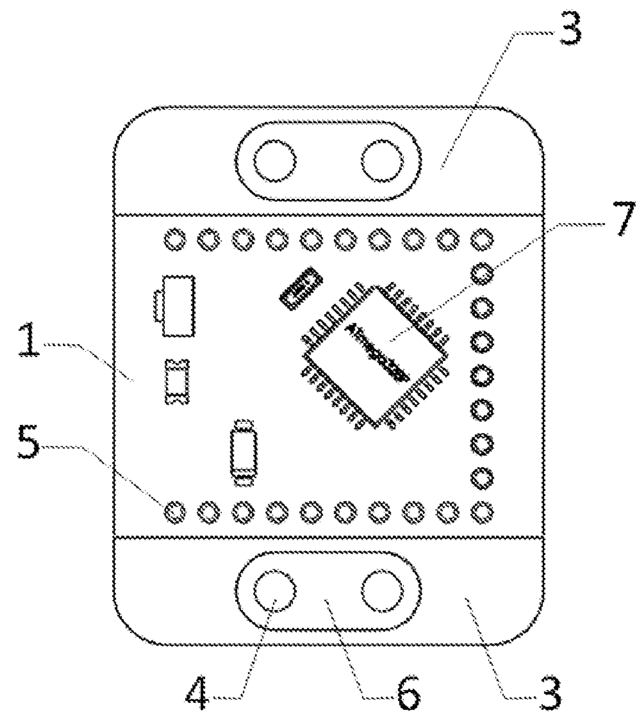
FIG. 8 illustrates a bottom view of the another exemplary module in FIG. 7 consistent with various disclosed embodiments.
Figure 9:
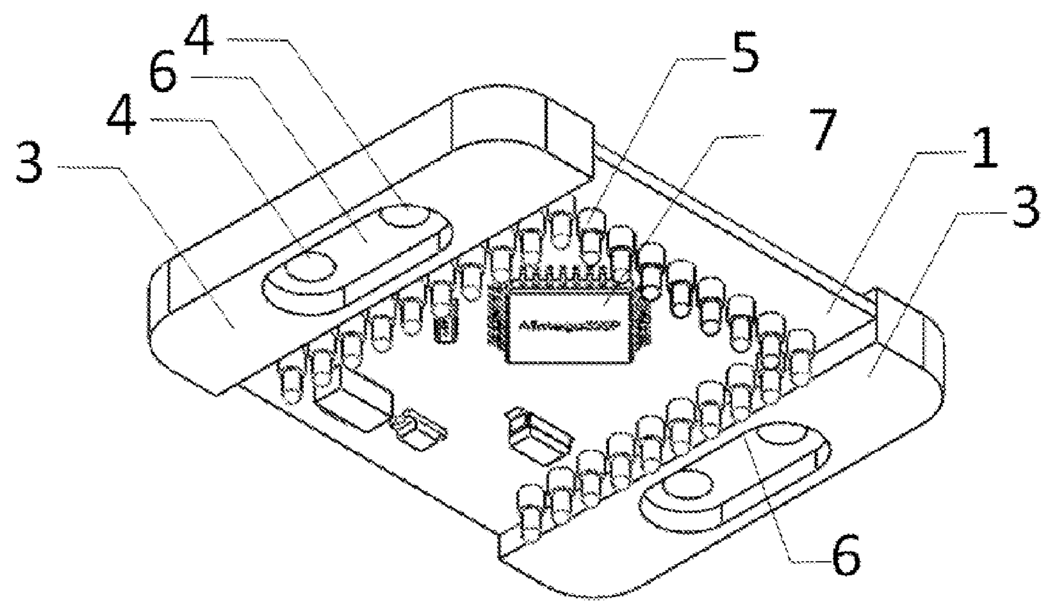
FIG. 9 illustrates a bottom perspective view of the exemplary module in FIGS. 7-8 consistent with various disclosed embodiments.

The chips/components can be electrically connected with PCB 1 and can provide corresponding module with desired functions. For example, FIGS. 7-9 illustrate a first exemplary module configured to a chip consistent with various disclosed embodiments. Specifically, FIG. 7 is a top view of the first exemplary module, containing a chip on a bottom surface, FIG. 8 is a bottom view of the first exemplary module containing the chip 7, and FIG. 9 is a bottom perspective view of the first exemplary module. In one embodiment, the chip 7 of the first exemplary module can be a core-type chip used as MCU (i.e., micro-control unit).

Figure 10:
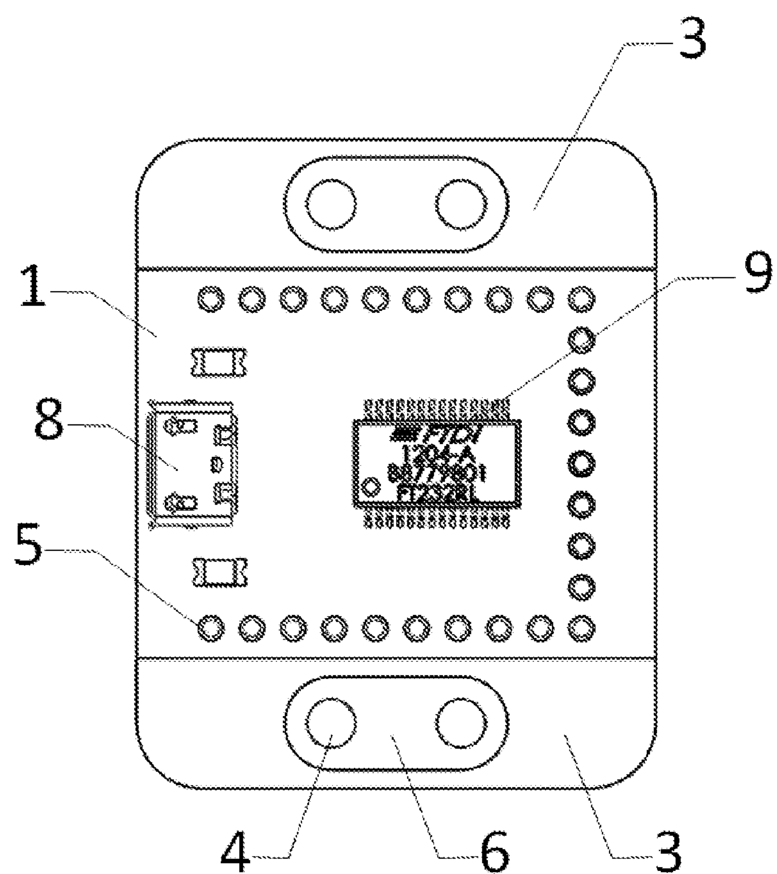
FIG. 10 illustrates a bottom perspective view of an additional exemplary module consistent with various disclosed embodiments.
Figure 11:
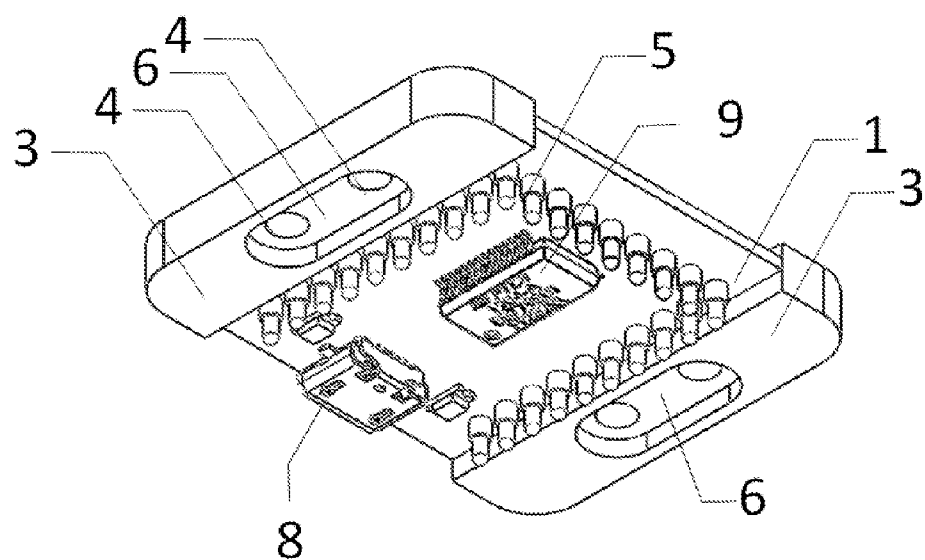
FIG. 11 illustrates a bottom view of the additional exemplary module in FIG. 10 consistent with various disclosed embodiments.

FIGS. 10-11 illustrate a second exemplary module configured with a chip 9 consistent with various disclosed embodiments. Specifically, FIG. 10 is a bottom view of the second exemplary module containing a micro USB jack 8 along with the chip 9, and FIG. 11 is a bottom perspective view of the second exemplary module in FIG. 10. In one embodiment, the chip 9 of the second exemplary module can be a USB2TTL chip used to transfer USB signal to TTL (i.e., transistor-transistor logic) signal.

Any suitable electrical chips (or IC chips) can be pre-assembled or otherwise integrated onto the PCB of a corresponding module, which can then be stacked into a modular electronic building system. Non-limiting examples of the electrical chips may include, microcontroller unit (8 bit, 16 bit, and 32 bit) (e.g., in FIGS. 7-9), ARM CPU, MIPS CPU, USB2TTL (e.g., in FIGS. 10-11), Ethernet, RS485, USB host, 2.4 GHz Wireless, 433 MHz Wireless, 866 MHz Wireless, 950 MHz Wireless, WiFi, Bluetooth, Zigbee, NFC, Micro SD, GPS, GPRS/GSM, 4G/LTE, wireless power charger, MP3 decorder, Amplifier, OLED, motor driver, stepper driver, RTC, accelarometer, gyroscope, magnetic field strength, Li-ion battery manager, double connect board, Arduino to Microduino pinout convert, galvanic skin sensors, arsenic detectors, resistors, capacitors, inductors, and/or configured in a same or different modules for making a desired modular electronic building system.

Each module in the modular electronic building system performs one or more discrete functions (e.g., an LED, a pushbutton, a light sensor, etc.), and the modules can be combined to create larger circuits. Some module may respond to external events such as mechanical forces, touch, proximity, radio frequency signals, environmental conditions, etc. Other modules may be pre-programmed to be, for example, synthesizers, oscillators, etc. Still other modules may be simply used to pass current like wire modules. Yet other modules may provide current to be, for example, power blocks/modules. The system may further include, for example, adapter boards to other electronic block building systems and interfaces.

Modules in the disclosed electronic block building system can be electrically connected with one another. For example, the PCB 1 may include electrical conductors, such as metal probes and pin connectors 5, for electrical connections between adjacent stacked modules to carry the current from one module to the next module. The exemplary pin connector may be spring pins to prevent damage during usage and to further extend service life of modules.

The pin connector 5 may include any number of spring probes with any suitable arrangement. The pin connector may be used to accommodate electrical current and/or communication from one module to the next module. For example, the pin connector may be spring pins such as pogo pins to ensure connections between stacked modules. In one embodiment, the pogo pins can include about 27 pogo pins arranged in a U-shape, about 44 pogo pins arranged in an H-shape, or about 88 pogo pins arranged in an H-shape. Further, any suitable means other than spring probes may be used to transmit electrical current and/or communication from one module to another module, as encompassed in the present disclosure.

In various embodiments, a module may be formed by first configuring (e.g., by welding or soldering) electrical chips onto the PCB board to form an integrated board. Housing members such as plastic housing member, magnets, and the integrated board may then be assembled together to form the module.

Referring back to FIGS. 1-3, the inter-locking parts 4 may be configured in the housing member 3 connecting each side of the PCB 1. For example, the inter-locking parts 4 may be configured to pass through an entire thickness of the housing member 3. In one embodiment, one or more inter-locking parts 4 may be configured to pass through one housing member 3. For example, the inter-locking parts 4 may be positioned between adjacent magnets 2 within each housing member 3. In other embodiments, any suitable arrangement between the inter-locking parts 4 and magnets 2 may be included within each housing member 3. For example, one inter-locking part 4 may be intersected with one magnet 2 within each housing member 3.

The inter-locking parts 4 may have protrusions extending from the top surface of the housing member 3 and thus extending from the top surface of the PCB 1. In one embodiment, the housing members 3 and/or protrusions of the inter-locking parts 4 may be made of non-conductive materials, such as plastic.

The inter-locking part 4 may have a hollow structure, as shown in FIGS. 1-2. The hollow structure of the inter-locking part 4 may have various cross-sectional shapes including, but not limited to, a circle, an oval, a rectangle, a square, and a triangle.

An opening 6 may be formed in the bottom of the housing member 3 and may be an indentation structure (such as a grove, a trench, and/or a racetrack-shaped structure) to have a depth into the housing member 3 from the bottom surface of the housing member 3, as shown in FIG. 2. The opening 6 may have a cross-section shape including, but not limited to, an oval, a circle, a rectangle, a square, and a triangle. In one embodiment, the opening 6 has a race-track cross-section shape.

The opening 6 in the bottom of each housing member 3 may be positioned corresponding to the inter-locking parts 4 passing through each housing member 3, such that the opening 6 exposes the hollow structures of the inter-locking parts 4. In other words, the hollow structures of the inter-locking parts 4 may pass through the housing member 3 to connect to the opening 6 in the bottom of the housing member 3.

The dimensions (e.g., depth), shape, and/or position of the opening 6 in the bottom of the housing member 3 may be determined based on dimensions, shape, and/or position of protrusions of inter-locking parts 4 of the same or different modules. For example, opening 6 in the bottom of the housing member 3 and protrusions of inter-locking parts 4 extending above the top surface of the housing member 3 may be correspondingly configured, such that an opening 6 in the bottom of a first module may be engaged or cooperated with protrusions of inter-locking parts 4 above a top surface of a second module to inhibit the magnetically stacked modules (e.g., the first and second modules) from sliding at their interface to therefore further inter-lock the two modules. In this case, the first module is vertically stacked and locked on the second module by engaging opening 6 of the first module with protrusions of inter-locking parts 4 of the second module.

Further, the hollow structure of the inter-locking part 4 in each module may allow easy fix and stacking of any number of modules, e.g., by passing a nylon string or a standard screw, such as an M3 screw, through corresponding hollow structures of the inter-locking parts 4 in the modules. This further locks positions of a desired number of modules in the disclosed modular electric building block system.

In one embodiment, the protrusions of inter-locking parts 4 above the top surface of the housing member 3 may have a cylindrical cross-section, while the opening 6 indented in the bottom of the housing member 3 may have a race-track cross-section.

Further, the protrusions of the inter-locking parts 4 on the top surface of the housing member 3 and/or the opening 6 in the bottom of the housing member 3 may be configured having dimensions, shape, and/or position compatible with other different type(s) of suitable building block systems, such as a toy building block system. The toy building block system may include, for example, an LEGO® building block system.

In one embodiment, the protrusion of the inter-locking part 4 may be, e.g., a circular fixator, or any suitable element, protruded or raised from the top surface of the housing member 3, and being able to directly cooperate with any types of toy building blocks such as a LEGO® building blocks.

In various other embodiments, the protrusions of the inter-locking part 4 may be configured extending from a bottom surface of the housing member 3, while the opening 6 may be correspondingly configured in the top surface of the housing member 3, to provide similar functions as shown in FIGS. 1-11 to allow a vertical stacking of various modules, engagement with other type of building blocks, fix of the hollow structures of the inter-locking part 4 among stacked modules, etc.

Figure 12:
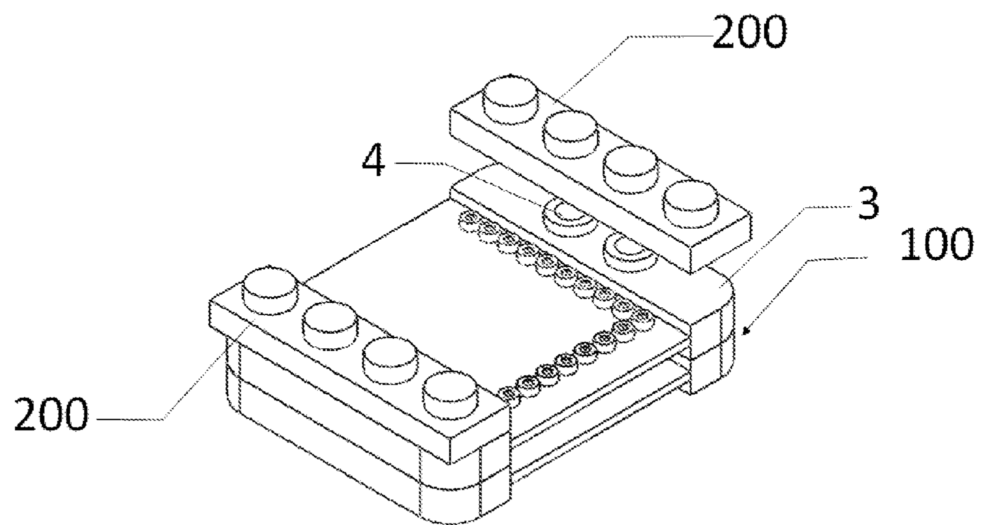
FIG. 12 illustrates an exploded top perspective view of a modular electric building block system coupled with a different type of building block system from top of the modular electric building block system consistent with various disclosed embodiments.
Figure 13:
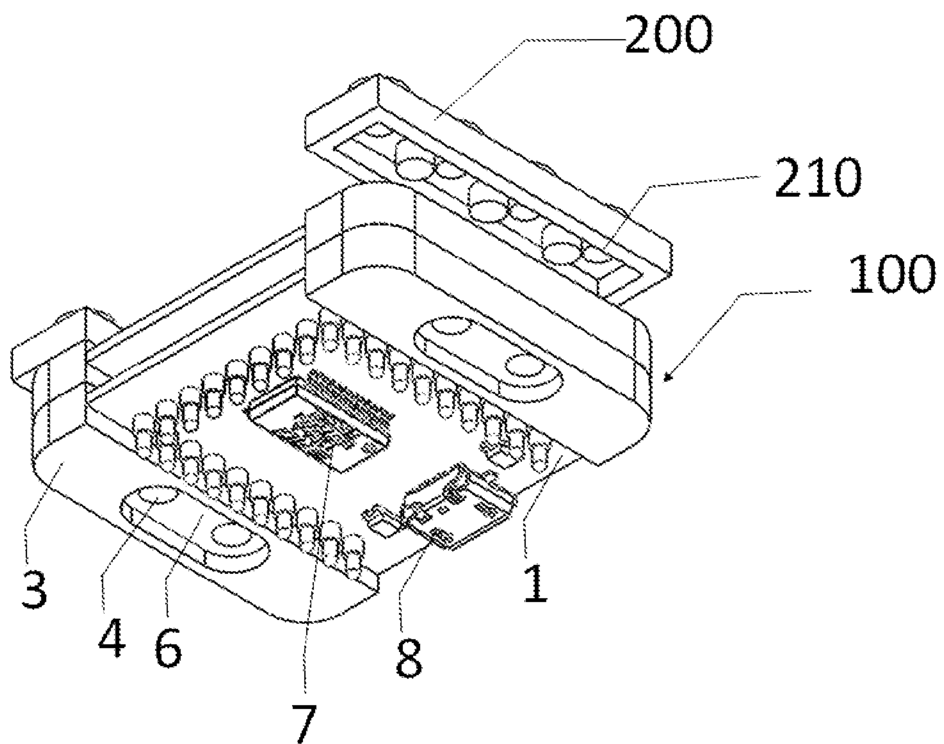
FIG. 13 illustrates an exploded bottom perspective view of a modular electric building block system coupled with a different type of building block system in FIG. 12 consistent with various disclosed embodiments.
Figure 14:
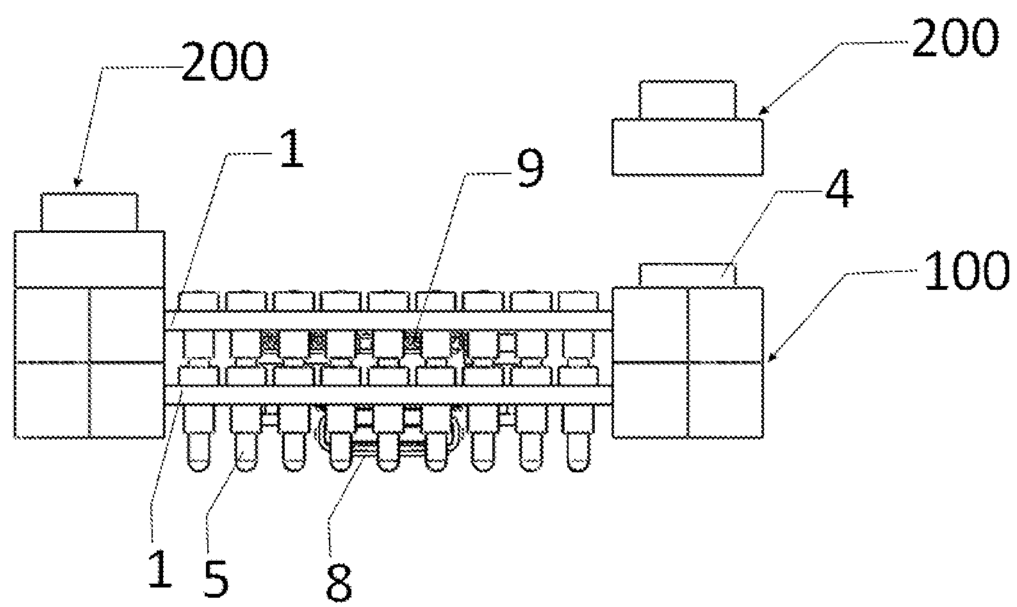
FIG. 14 illustrates an exploded cross-section view of a modular electric building block system coupled with a different type of building block system in FIGS. 12-13 consistent with various disclosed embodiments.

FIGS. 12-14 illustrate a modular electric building block system coupled with a different type of building block system from the top of the disclosed modular electric building block system. Specifically, FIG. 12 illustrates an exploded top perspective view of a modular electric building block system 100 coupled with a different type of building block system 200 from the top of the modular electric building block system 100, FIGS. 13-14 illustrate an exploded bottom perspective view and an exploded cross-section view of the modular electric building block system 100 coupled with the different type of building block system 200, respectively.

As shown in FIGS. 12-14, protrusions of the inter-locking 4 extending above the top surface of the housing member of the system 100 may be used as mounting members adapted to engage complementarily shaped receptacles 210 defined in the bottom surface of the different type of building block system 200. For example, protrusions of the inter-locking parts 4 may be appropriately spaced and shaped, such that a toy building block system, such as LEGO® building block system, may receive, couple, and/or lock the inter-locking part 4 in receptacles defined in the LEGO® building block.

It should be appreciated that no additional mounting members are needed to facilitate such incorporation for LEGO® building blocks to be locked on the disclosed electrical modules. Further, each module in the disclosed modular electric building block system can be able to independently or all together be engaged with one or more LEGO® building blocks.

Figure 15:
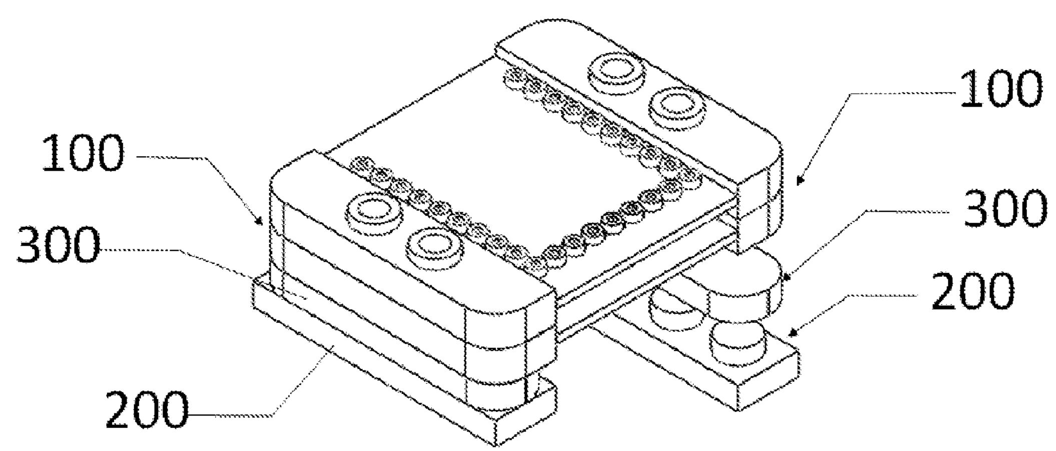
FIG. 15 illustrates an exploded top perspective view of a modular electric building block system coupled with a different type of building block system from bottom of the modular electric building block system consistent with various disclosed embodiments.
Figure 16:
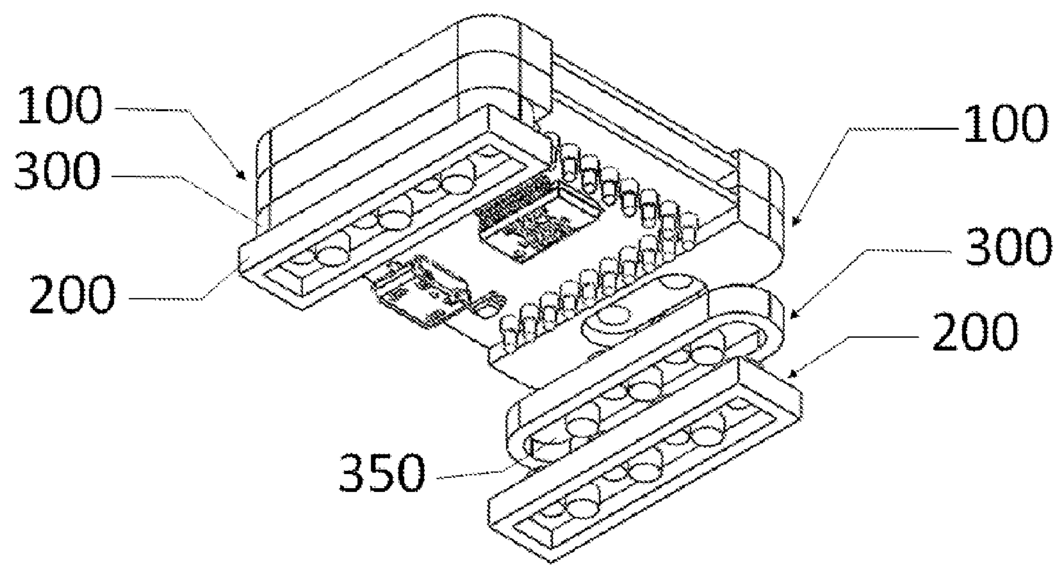
FIG. 16 illustrates an exploded bottom perspective view of a modular electric building block system coupled with a different type of building block system in FIG. 15 consistent with various disclosed embodiments.
Figure 17:
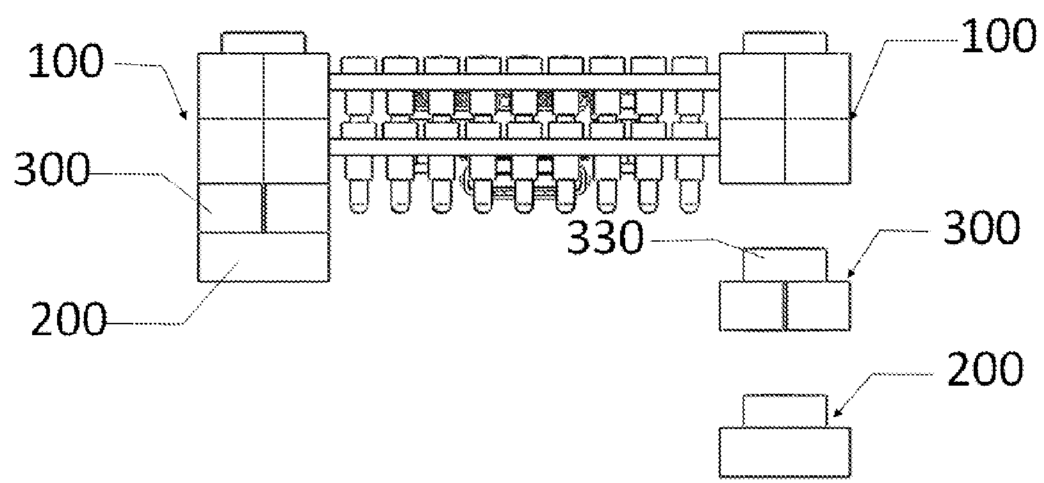
FIG. 17 illustrates an exploded cross-section view of a modular electric building block system coupled with a different type of building block system in FIGS. 15-16 consistent with various disclosed embodiments.

FIGS. 15-17 illustrate a modular electric building block system coupled with a different type of building block system from the bottom of the disclosed modular electric building block system. Specifically, FIG. 15 illustrates an exploded top perspective view of a modular electric building block system 100 coupled with a different type of building block system 200 from bottom of the modular electric building block system 100 using a bridge element 300, FIGS. 16-17 illustrate an exploded bottom perspective view and an exploded cross-section view of the modular electric building block system 100 coupled with the different type of building block system 200 using the bridge element 300, respectively.

As shown in FIGS. 15-17, the opening 6 having a depth into the bottom of the housing member of the system 100 may be adapted to engage with the bridge element 300 having complementarily shaped protrusion structures 330 defined on top of the bridge element 300. Meanwhile, the bottom of the bridge element 300 may have receptacle structures 350 complementarily shaped with top structures, e.g., protrusions, defined in the top surface of the different type of building block system 200, such as LEGO® building block system.

The bridge element 300 may thus be used as a mounting member capable of being engaged with the modular electric building block system 100 on one side (e.g., an upper side of the bridge element 300) and engaged with the different type of building block system 200 on an opposite side (e.g., a bottom side of the bridge element 300).

As shown in FIGS. 12-14 and FIGS. 15-17, the combination of the modular electric building block system(s) 100 with different type(s) of building block system(s) 200 may allow children and/or adults to play, create, or integrate desired electrical modules into projects, toys and products in an easy way. For example, electrical building products may be created to include multiple modular electric building block systems 100 connected by one or more different type of building block systems 200 in a vertical direction with or without using a bridge member.

In various embodiments, the disclosed modular electric building block system 100 may be coupled with and accommodate any types of building block systems (including toy building block systems), to which the protrusions of the inter-locking part 4 and/or the opening 6 are intended to couple, in any suitable manner.

In this manner, standalone modules are provided that may enable users, with little or no electronics or programming experience, to construct basic and complex products such as sensors, and/or interaction-based analog and digital circuits. The disclosed modules may be reusable, re-arrange-able, and scalable from small and simple circuits to large and complex circuits, and may be sophisticated enough to allow for complex design of behavior through manipulating tangible modules. For example, an electrical module may have a small size comparable with a US quarter coin.

Additionally, the modules may be transformed into a collection of electronic components that can be used to create bigger and more complex components or systems. Indeed, a user/player/maker can expand the module collection almost indefinitely, adding any new component that they wish to use to their module repository. Users can even create their own modules and add them to the rest of the collection.

In various embodiments, a modular electric building block system 100 including a desired number of modules may be commercialized as a single kit or set. The kit may include one or more different modules or different types of modules, and a container in which to store these modules, and may further include accessories, instructions, or other suitable components. The kit may include a number of modules that may be intended to be assembled in a number of combinations, including a single combination, to perform a number of functions. The kits may also be directed to a certain age group, with a kit for the elementary level including fewer and/or less complicated modules than a kit designed for the high school level, for example.

Therefore, hundreds of other combinations are possible with different modules having different functionality all forming different circuits, with immediate response of the elements, and without any need for programming, soldering or circuit assembly. The user is able to design behavior of the circuit by manipulating physical elements and without any code writing.

The pre-programmed and pre-assembled modules may be selected from the module collection to enable complex prototypes and circuits built as a modular electric building block system with no programming or electronics knowledge. In addition, each module can have different colors to further distinguish from one another and to bring users with better experience.

Further, users may create their own functional module by using specific applications to copy pre-written code into the modules without requiring expertise in the logic of programming and circuit building. For example, all desirable program coding may be pre-prepared for users to copy from a network (e.g., a website) and to paste into the module using blue-tooth connections.

Even further, products or objects may be built with lights, sounds, buttons and other electronic components very easy to kids, young students, designers, non-engineers, and others lacking necessary experience. Electronics become more accessible to non-experts in a cost effective manner. The disclosed modules and systems may provide a platform to enhance learning, enable experimentation and promote innovation.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An electrical module, comprising:

a printed circuit board (PCB) having a top surface, a bottom surface, and opposite sides between the top surface and the bottom surface;

a housing member attached to each side of two opposite sides of the PCB, wherein the housing member includes an opening in a bottom surface of the housing member;

two or more magnets arranged within the housing member and capably of magnetically attaching the electrical module to another electrical module; and one or more inter-locking parts configured to pass through the housing member on each side of the PCB, wherein each inter-locking part has a protrusion extending from a top surface of the housing member and is exposed to the opening in the bottom surface of the housing member; and within a same housing member, an inter-locking part is positioned between two adjacent magnets.

2. The module of claim 1, wherein each inter-locking part has a hollow structure.

3. The module of claim 2, wherein the hollow structure of each inter-locking part has a cross sectional shape including a circle, an oval, a rectangle, a square, and a triangle.

4. The module of claim 1, wherein the protrusion of each inter-locking part extending from the top surface of the housing member includes a cylinder.

5. The module of claim 1, wherein the opening in the bottom surface of the housing member is configured capable of receiving one or more inter-locking parts of the another electrical module.

6. The module of claim 1, wherein the opening in the bottom surface of the housing member has a cross sectional shape including a circle, an oval, a rectangle, a square, and a triangle.

7. The module of claim 1, wherein the protrusion of each inter-locking part is capable of being independently or all together engaged with a toy building block directly.

8. The module of claim 1, wherein the opening in the bottom surface of the housing member is capable of being engaged with a bridge element on a top side, wherein the bridge element has a bottom side capable of being engaged with a toy building block.

9. The module of claim 1, wherein the PCB has a top view shape including a rectangular shape, a square shape, and a trapezoid shape.

10. The module of claim 1, wherein the one or more magnets include four magnets configured inside of four corners of the electrical module.

11. The module of claim 1, wherein the PCB includes pin connectors for electrical connections between adjacent stacked electrical modules, and wherein the pin connectors include spring pins, the spring pins including pogo pins.

12. The module of claim 11, wherein the pin connectors include about 27 spring pins arranged in a U-shape, about 44 spring pins arranged in an H-shape, or about 88 spring pins arranged in an 1H-shape.

13. A modular electrical building system, comprising:

a plurality of electrical modules vertically stacked and having a first electrical module on a second electrical module, wherein each electrical module includes:

a printed circuit board (PCB) having a top surface, a bottom surface, and opposite sides between the top surface and the bottom surface;

a housing member attached to each side of two opposite sides of the PCB, wherein the housing member includes an opening in a bottom surface of the housing member;

one or more magnets arranged within the housing member and capably of magnetically attaching the electrical module to another electrical module; and one or more inter-locking parts configured to pass through the housing member on each side of the PCB, wherein:

each inter-locking part has a protrusion extending from a top surface of the housing member and is exposed to the opening in the bottom surface of the housing member;

within a same housing member of the electrical module, one inter-locking part is positioned between two adjacent magnets; and the PCB of the first electrical module includes pin connectors for electrical connections with the PCB of the second electrical module when the second electrical module is stacked adjacently on the first electrical module, the pin connectors being pogo pins.

14. The system of claim 13, wherein the one or more magnets include four magnets configured inside of four corners of each of the plurality of electrical modules.

15. The system of claim 13, wherein the opening in the bottom surface of the housing member of the first electrical module is capable of receiving and locking in position the protrusions of the one or more inter-locking parts of the second electrical module.

16. The system of claim 13, wherein each inter-locking part has a hollow structure.

17. The system of claim 13, wherein the protrusion of each inter-locking part is capable of being independently or all together engaged with a toy building block directly.

18. The system of claim 13, wherein the opening in the bottom surface of the housing member is capable of being engaged with a bridge element on a top side, wherein the bridge element has a bottom side capable of being engaged with a toy building block.

* * * * *